United States Patent
Balog

(10) Patent No.: US 9,329,220 B2
(45) Date of Patent: May 3, 2016

(54) METHOD AND SYSTEM FOR DETECTING ARC FAULTS AND FLASHES USING WAVELETS

(71) Applicant: The Texas A&M University System, College Station, TX (US)

(72) Inventor: Robert S. Balog, College Station, TX (US)

(73) Assignee: The Texas A&M University System, College Station, TX (US)

( * ) Notice: Subject to any disclaimer, the term of this patent is extended or adjusted under 35 U.S.C. 154(b) by 438 days.

(21) Appl. No.: 14/011,553

(22) Filed: Aug. 27, 2013

(65) Prior Publication Data

US 2014/0067291 A1  Mar. 6, 2014

Related U.S. Application Data

(60) Provisional application No. 61/693,752, filed on Aug. 27, 2012.

(51) Int. Cl.
| | |
|---|---|
| G01R 31/00 | (2006.01) |
| G01R 31/02 | (2006.01) |
| G01R 31/12 | (2006.01) |
| H02H 1/00 | (2006.01) |
| H02S 50/10 | (2014.01) |
| H02H 3/44 | (2006.01) |
| H02H 3/46 | (2006.01) |
| G06F 11/30 | (2006.01) |

(52) U.S. Cl.
CPC ............ *G01R 31/02* (2013.01); *G01R 31/1227* (2013.01); *H02H 1/0015* (2013.01); *H02H 3/44* (2013.01); *H02H 3/46* (2013.01); *H02S 50/10* (2014.12)

(58) Field of Classification Search
CPC ....................................................... G01R 31/02
See application file for complete search history.

(56) References Cited

U.S. PATENT DOCUMENTS

| | | | | |
|---|---|---|---|---|
| 5,578,931 | A * | 11/1996 | Russell ................ | H02H 1/0015 324/536 |
| 2010/0033888 | A1* | 2/2010 | Dougherty ........... | G01R 31/026 361/93.2 |

* cited by examiner

*Primary Examiner* — Phuong Huynh
(74) *Attorney, Agent, or Firm* — Boisbrun Hofman, PLLC

(57) ABSTRACT

A method for detecting an arc event occurring in an electrical system includes sensing a voltage using a voltage sensing device coupled to a component of the electrical system, producing a signal waveform representative of the sensed voltage using the voltage sensing device, and sampling at a predetermined frequency the voltage signal waveform to generate a plurality of sample waveforms. The method further includes applying a wavelet transform to each sample waveform to decompose them into a predetermined number of detailed waveforms using a corresponding number of successive wavelet components, dividing each detailed waveform into a plurality of segments, analyzing the plurality of segments to detect a change in one or more of the properties of the corresponding detailed waveform, and determining an occurrence of the arc event based on the duration of the detected change of one or more of characteristics of the corresponding detailed waveform.

22 Claims, 18 Drawing Sheets

METHOD AND SYSTEM FOR DETECTING ARC FAULTS AND FLASHES USING WAVELETS

RELATED APPLICATIONS

This application claims the benefits under 35 U.S.C. 119(e) of Provisional Patent Application Ser. No. 61/693,752, filed Aug. 27, 2012, which is hereby incorporated by reference.

BACKGROUND

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Arc faults can cause system failures, shock hazards, and fires in photovoltaic (PV) and other direct-current (DC) systems such as microgrids. Arc faults can also be present in small-scale residential ac power system as well as large-scale utility power systems and can pose significant threats to human safety and property. As such, the PV industry faces significant concerns about liability and the impact upon widespread adoption of photovoltaic energy. Thus, arc fault detection is extremely important for the reliable and safe operation of PV systems.

Typical arc fault detectors are configured to only respond to series arc faults in alternating current (AC) circuits. DC electrical arcs in PV systems can be caused by loose electrical connections (series arc fault) or by conductors secured to a mounting frame becoming abraded due to thermal expansion, vibration, nesting rodents, or failure within the PV modules (parallel arc fault).

In addition to detecting arc faults, it would be useful to detect arc flashes, which may be the pre-fault (before a sustained arc forms) events of sparking and dielectric breakdown, and which may only last for a short duration (such as less than a second) but may serve as an early indicator of insidious arc faults.

As such, there is a need for a method and system that can detect arc faults and flashes in both AC and DC electrical systems.

SUMMARY

Disclosed herein is a method and system for detecting arc flashes and arc faults using wavelets.

In one embodiment, a computer-implemented method for detecting an arc event occurring in an electrical system is provided. The method includes sensing a voltage using a voltage sensing device coupled to a component of the electrical system, wherein the component need not be conductively directly connected to an occurrence location of the arc event in the electrical system, producing a signal waveform representative of the sensed voltage using the voltage sensing device, and sampling at a predetermined frequency the voltage signal waveform to generate a plurality of sample waveforms. The method further includes applying a wavelet transform to each of the plurality of sample waveforms to decompose them into a predetermined number of detailed waveforms using a corresponding number of successive wavelet components, wherein each of the successive wavelet components is a time-domain waveform that covers a predetermined frequency band, dividing each detailed waveform into a plurality of segments, analyzing the plurality of segments to detect a change in one of the properties of the corresponding detailed waveform within the segments and/or between the segments, and determining a type of the arc event based on the detected change of one of the properties of the corresponding detailed waveform.

In another aspect, a system for detecting an arc event occurring in an electrical system includes a voltage sensing device for sensing a voltage, wherein the voltage sensing device is coupled to a component of the electrical system. The component is not conductively directly connected to an occurrence location of the arc event in the electrical system, and the voltage sensing device produces a signal waveform representative of the sensed voltage, and a controller for implementing the above discussed computer-implemented method.

These as well as other aspects, advantages, and alternatives will become apparent to those of ordinary skill in the art by reading the following detailed description, with reference where appropriate to the accompanying drawings. Further, it should be understood that this summary section and the rest of this document are intended to discuss the provided disclosure by way of example only and not by way of limitation.

DETAILED DESCRIPTION

Figure 1:
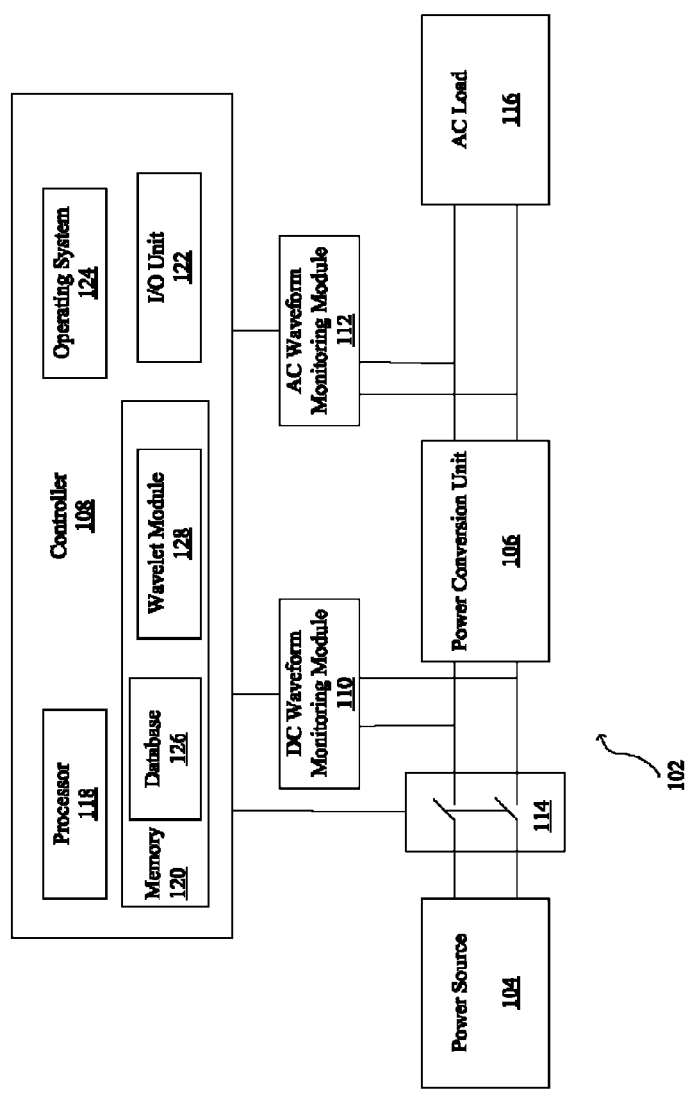
FIG. 1 is a block diagram of an exemplary embodiment of a system for detecting arc flashes and faults using wavelets.

In the following detailed description, reference is made to the accompanying figures, which form a part thereof. In the figures, similar symbols typically identify similar components, unless context dictates otherwise. The illustrative embodiments described in the detailed description and figures are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are contemplated herein.

Overview

DC arc faults are known to introduce major safety concerns in a wide variety of components in DC networks. However, the randomness and instability of DC arc faults render them difficult to be detected. A detection algorithm utilizing both time and time-frequency domain characteristics is proposed to differentiate between dc arc fault and normal condition. The detection algorithm was then realized on a digital signal processing board and tested to verify the effectiveness. Experimental results show that the proposed algorithms can detect arc fault and flashes in a timely manner and is free of nuisance trip from normal circuit operations such as load change condition, capacitor switchings, and the like.

Existing methodologies or systems configured to detect arc faults can only respond to series arc faults in AC circuits because they rely on current detecting devices. Moreover, as stated above, detecting arc flashes is a difficult problem because unlike a bolted "hard short" fault, arc flashes in electrical systems, such as PV systems, microgrids, or other finite energy systems, may not draw sufficiently high root mean square (RMS) current or have a high enough energy to trip a thermal or magnetic circuit breaker. In one embodiment where the electrical system comprises a PV array, due to distributed capacitance of the PV array, noise from inverter switching and other electromagnetic interferences may make it difficult to detect this arcing. Further complicating the detection is that typically arc fault and flashes are non-stationary and non-periodic signals, and thus may not have easily recognizable amplitude or frequency signatures for pattern recognition techniques.

Moreover, spectral analysis using Fourier techniques to decompose the frequencies of a sustained arc or bolted fault requires a linear system and a stationary signal and is therefore not capable of detecting arc flashes. An obvious disadvantage of conventional Fourier series is that the original signal has to be periodic. However, as discussed above the nature of arc flashes and arc faults in power systems is not periodic. In addition, conventional Fourier transform gives only frequency information. A short-time Fourier transform (STFT), which windows the input signal and overcomes the temporal localization problem, does not provide multiple resolution in time and frequency because the window is fixed. As the frequency of the signal increases, more cycles are contained within the windows and thus individual frequency components are not treated in the same way. In power systems, most power signals of interest include a combination of impulse-like events such as spikes and transients for which STFT and other conventional frequency-based methods are much less suited for analysis.

Accordingly, exemplary methods and systems are configured to detect arc flashes and faults by analyzing voltage waveforms using wavelet transforms. Because voltage waveforms include more information than current waveforms, the proposed systems are configured to utilize voltage sensing devices to sense voltages that are analyzed to detect arc faults and arc flashes. Moreover, because sensed voltages are affected by arc and flash events regardless of where they occur in the system, the voltage sensing devices need not be conductively directly connected to the locations of the arc and flash events.

Unlike STFT, the windowing of wavelet transforms can be adjusted automatically for low and high frequencies so that each frequency component is treated in the same manner, without any interpretation of the results. This enables wavelet transformation to produce better performance in terms of fault identification and localization. That is, unlike conventional techniques, such as those using time-domain and frequency domain techniques (e.g. FFT), a wavelet technique can localize temporally and spatially arc fault and flash events.

In one embodiment, this wavelet technique can be integrated into a central inverter, a string array, a combiner box, or any other system component that provides on-line monitoring of a power generating system, such as a solar power system for example. It is further expected that this wavelet technique can be integrated with other system functions, such as a resistance test required for transformerless inverter systems, thus adding safety functionality and reducing the balance-of-system costs. Broad applications of this wavelet technique include any AC or DC system, such as energy systems, microgrids, building systems, server systems, telecommunication systems, and wearable personal power systems (e.g., smart clothing and wearable computers).

As known to one ordinary skill in the art, the wavelet analysis procedure employs a wavelet prototype function, called a "mother wavelet," which provides a localized signal processing method to decompose a differential current or voltage signal into a series of wavelet components, each of which is a time-domain signal that covers a specific frequency band. Wavelets are particularly effective in approximating functions with discontinuous or sharp changes like power system fault signals. As such, with proper choice of the "mother wavelet," a wavelet transformation can be an effective tool for fault and flash detection.

As known to one ordinary skill in the art, there are many types of wavelets, such as Harr, Daubechies 4, Daubechies 8, Coiflet 3, and Symmlet 8, to name a few. A user can choose among them depending on the particular application. The wavelet transform has a digitally implementable counterpart, the discrete wavelet transform (DWT), similar to the discrete Fourier transform (DFT) implementation of the continuous-signal Fourier transform. The DWT is defined as:

$$C(j,k) = \sum_{n \in Z} s(n) g_{j,k}(n) \quad (j \in N, k \in Z) \qquad \text{Equation 1}$$

where n is the sample number, s(n) is the signal to be analyzed and $g_{j,k}(n)$ is the discrete wavelet function, which is defined by:

$$g_{j,k}(n) = a_0^{-j/2} g(a_0^{-j} n - k\, b_0) \qquad \text{Equation 2}$$

By careful selection of the coefficients $a_0$ and $b_0$, the family of scaled and shifted mother wavelets constitute an orthonormal basis of $l^2(Z)$ (set of signals of finite energy). By simply choosing $a_0=2$ and $b_0=1$, a dyadic-orthonormal wavelet transform is obtained. With this choice, there exists an elegant algorithm, the multiresolution signal decomposition (MSD) technique, which can decompose a signal into different levels with different time and frequency resolutions (e.g., scales). As such, the multiresolution signal decomposition produces several other signals of different scales with different time and frequency resolutions.

Figure 3:
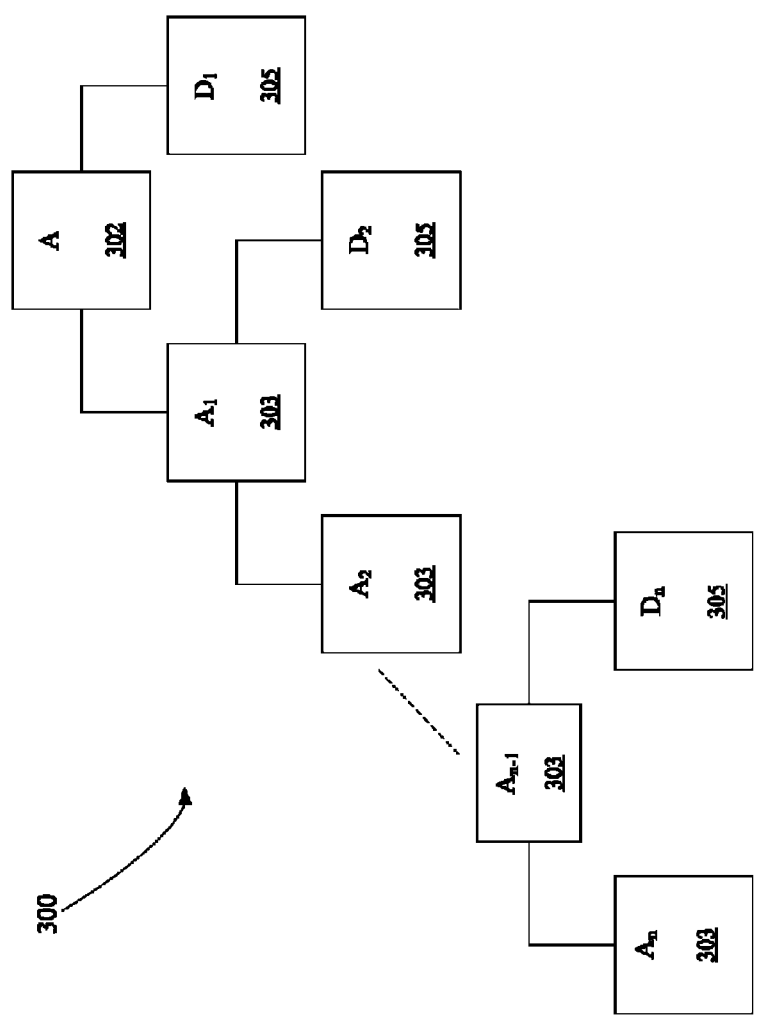
FIG. 3 is a block diagram illustrating a successive decomposition of signal waveforms into detailed and approximate waveforms signals.

As shown in FIG. 3, a block diagram 300 illustrates a successive decomposition of a sampled version of a continuous signal waveform A. At each level j, approximation and detail signal waveforms $A_j$ and $D_j$ can be created. The words "approximation" and "detail" are justified by the fact that signal waveform $A_j$ is an approximation of signal waveform $A_{j-1}$ taking into account a "low frequency" of signal waveform $A_{j-1}$, whereas the detail signal waveform $D_j$ corresponds to a "high frequency" correction. A successive decomposition, shown below, is configured to reveal increasing information about the original continuous signal waveform A, as well as its successive detailed and approximate signal waveforms $A_j$ and $D_j$.

$$A = D_1 \oplus A_1 \qquad \text{Equation 3}$$
$$= D_1 \oplus D_2 \oplus A_2$$
$$\vdots$$
$$= D_1 \oplus D_2 \oplus \ldots \oplus D_n \oplus A_n$$

The coefficients C(j,k) generated by the DWT constitute the "resemblance indexes" between the signal s(n) and the wavelet $g_{j,k}(n)$. If a coefficient C(j,k) is large, the resemblance will be strong; otherwise, it is slight. The signal can be recreated from the DWT coefficients as:

$$s(n) = \sum_{j \in N} \sum_{k \in Z} C(j,k) g_{j,k}(n) \qquad \text{Equation 4}$$

The detail Dj term is defined for a fixed j as the sum over index k:

$$D_j(n) = \sum_{k \in Z} C(j,k) g_{j,k}(n) \qquad \text{Equation 5}$$

Then summing over index j, the signal is found from the detail $D_j$:

$$s(n) = \sum_{j \in N} D_j(n) \qquad \text{Equation 6}$$

For a reference level J, there are two categories of details:
1) those details associated with indices j≤J correspond to the scales 2j≤2J, which are the fine details.
2) the other details correspond to j>J and are the coarse details, which defines an approximation of the signals:

$$s = A_J + \sum_{j \leq J} D_j \qquad \text{Equation 7}$$

which signify that s is the sum of its approximation $A_J$ improved by the fine details. The coefficients produced by DWT, therefore, can be divided into two categories: one is detail coefficient, the other is approximation coefficient. To obtain them, MSD provides an efficient algorithm known as a two channel sub-band coder using quadrature mirror filters. Then, the detail part is still represented by wavelets, which can be regarded as series of band-pass filters, whereas the approximation is represented by the dilation and translation of a scaling function, which can be regarded as a low-pass filter.

As known to one of ordinary skill in the art, Daubechies wavelets, one of the many types of wavelets introduced above, can be classified according to their number of vanishing moments: the smoothness of the scaling function and wavelet increases with the number of vanishing moments. Daubechies wavelets showed that for every N, which a positive integer, there will be 2N non-zero real scaling coefficients $p_0, \ldots, p_{2N-1}$, resulting in a scaling function and wavelet that are supported on the interval 0≤t≤2N−1:

$$\phi(x) = \sum_{k \in Z} p_k \phi(2x - k) \qquad \text{Equation 8}$$

$$\psi(x) = \sum (-1)^k \overline{p_{1-k}} \phi(2x - k) \qquad \text{Equation 9}$$

$$p_k = 2 \int_{-\infty}^{\infty} \phi(x) \overline{\phi(2x-k)}\, dx \qquad \text{Equation 10}$$

where $\phi$ is the Daubechies scaling function and $\psi$ is the associated wavelets chosen so that the corresponding degree 2N−1 polynomial $$P_N(Z) = \frac{1}{2} \sum_{k=0}^{2N-1} p_k z^k$$

has the factorization:

$$P_N(z) = (z+1)^N \tilde{P}_N(z) \qquad \text{Equation 11}$$

where the degree of $\tilde{P}_N$ is N−1 and $\tilde{P}_N(-1)$ is ≠0. This guarantees that the associated wavelets will have precise "vanishing moments", which is shown as:

$$\int_{-\infty}^{\infty} x^k \psi_N(x)\,dx = \qquad \text{Equation 12}$$

$$\begin{cases} 0, & k = 0, \ldots, N-1 \\ -(2^{-N} N! / \sqrt{2\pi})\hat{P}_N(-1) \neq 0, & k = N \end{cases}.$$

Vanishing moments are a key factor in many wavelet application signal singularity detection.

Now referring to FIG. 1, a block diagram 100 of a system 102 for detecting arc flashes and faults using wavelet transforms, in accordance with one or more exemplary embodiments, is shown. System 102 comprises a power source 104, such as a PV array or power grid, which may be an AC or DC power system, a power conversion unit 106, a controlling unit or controller 108, a DC waveform sampling module 110, an AC waveform sampling module 112, a power interrupting unit 114, and a load unit or center 116.

Power conversion unit 106 may comprise a DC/DC conversion module (not shown) and a DC/AC inversion module (not shown). Power conversion unit 106 is coupled via two input terminals to power source 104 and via two output terminals to two input terminals of load unit 116. Power conversion unit 106 is coupled to controller 108. In one embodiment, the DC/DC conversion module and the DC/AC inversion module act to convert the DC power from power source 104 to a second DC power and then to an AC power, respectively, based on control signals from controller 108. As such, power conversion unit 106 may convert a DC current received from a PV array, associated with power source 104, to an AC current with controller 108 providing operative control and driving power conversion unit 106 to inject the generated AC output current in phase with load unit 116, which may be a power grid.

As shown, DC waveform sampling module 110 is coupled to the input terminals of power conversion unit 106, and the AC waveform sampling module 112 is coupled across the output terminals of power conversion unit 106. DC waveform sampling module 110 and AC waveform sampling module 112 are each coupled to controller 108. Additionally, power interrupting unit 114 is coupled across the two power conversion unit input terminals and to controller 108.

Controller 108 comprises at least one processor or central processing unit (CPU) 118, which is coupled to a memory unit 120, and an input/output unit 122. Processor unit 118 may further comprise one or more conventionally available microprocessors or digital signal processors (DSPs); additionally or alternatively, it may include one or more application specific integrated circuits (ASIC). Memory 120 may comprise random access memory, read only memory, removable disk memory, flash memory, and various combinations of these types of memory. Memory 120 is sometimes referred to as main memory and may, in part, be used as cache memory or buffer memory, and typically includes an operating system (OS) 124. OS 124 may be one of current or future commercially available operating systems such as, but not limited to, Linux, Real-Time Operating System (RTOS), and the like.

Memory 120 may store a variety of application modules, i.e., software modules. As shown in FIG. 1, memory 120 comprises a database unit 126 for storing data, and a waveform processing module 128 for detecting and managing DC and AC arc flashes and faults. Database unit 126 may store data related to the waveform monitoring and data related to processing performed by the waveform processing module 128; for example, sampled DC and AC waveform values, computed changes in signal waveform slope over time, one or more thresholds for use in determining DC and AC arc fault and flash events, and the like. In some embodiments, database unit 126 and/or waveform processing module 128, or portions thereof, may be implemented in software, firmware, hardware, or a combination thereof.

In accordance with one or more exemplary embodiments, waveform processing module 128 is configured to receive DC and AC voltage waveforms (signals) data (e.g., values) from DC waveform monitoring module 110 and AC waveform monitoring module 112, respectively, to detect and determine occurrences of DC and AC arc flashes and faults. In some embodiments, waveform processing module 128 may analyze, for example, every millisecond (msec) or as often as every microsecond (μsec) or faster, the DC and AC waveforms in order to identify an arc fault or an arc flash.

Figure 2:
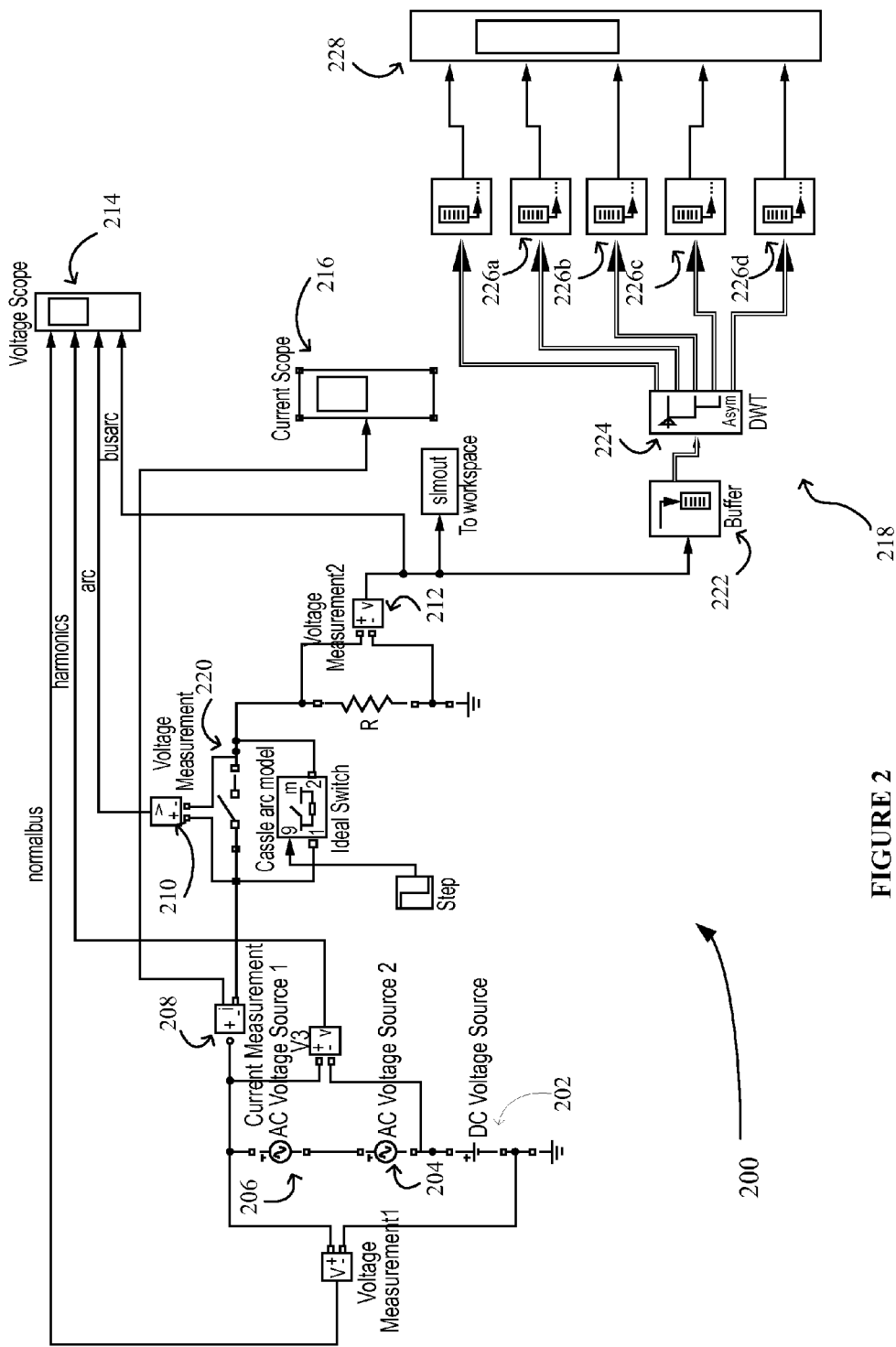
FIG. 2 is a block diagram of a system configured for simulating arc flashes and faults and detecting them using wavelets applied to DC signal waveforms.

Now referring to FIG. 2, an exemplary embodiment of an arc fault and flash simulation and detection system 200 is shown. Simulation and detection system 200 is configured to analyze DC waveforms in a similar fashion as waveform processing module 108. That is, the received DC waveform is processed by a wavelet decomposition process to generate successive approximation and detail signal waveforms $A_j$ and $D_j$, as discussed above.

As shown, system 200 includes a DC voltage source 202, a plurality of AC voltage sources 204 and 206, a current measurement unit 208, a couple of voltage measurement units 210 and 212, a voltage scope unit 214, a current scope unit 216, and a wavelet transform module 218. AC voltage sources 204 and 206 are configured to augment a DC voltage provided by DC voltage source 202 with select harmonics. System 200 further includes a switching unit 220 configured to simulate arc faults. Voltage scope unit 214 is configured to receive as inputs four signal waveforms corresponding to the original DC voltage, the select harmonics, arc fault signal, and a bus arc fault signal, which is also provided to wavelet module 218.

As shown in FIG. 2, wavelet module 218 includes a buffer unit 222, a DWT unit 224, which is configured to generate four detailed signal waveforms and provide them through unbuffer modules 226a-226d to a wavelet scope unit 228.

Figure 4:
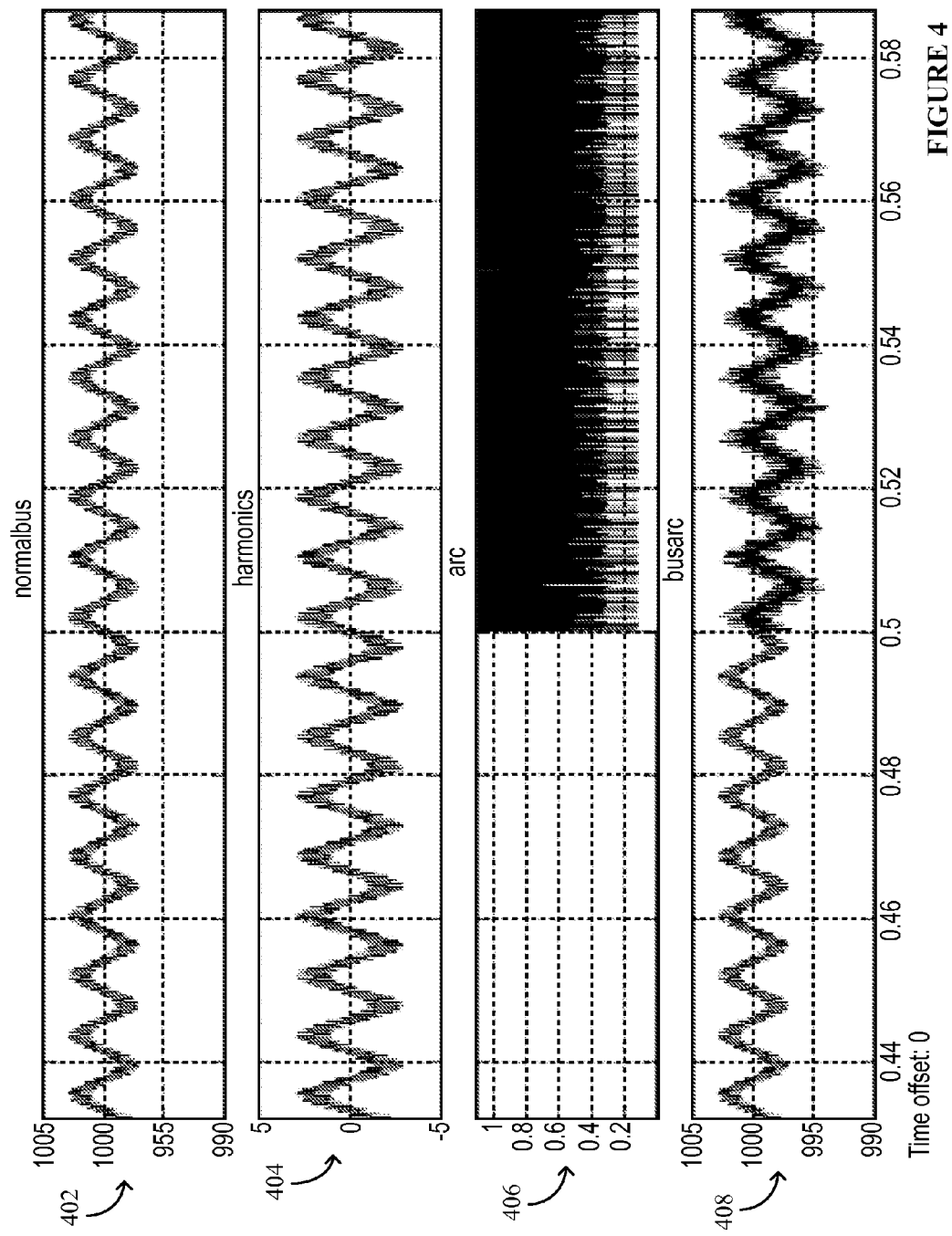
FIG. 4 is a graph illustrating a DC voltage waveform superimposed with a select number of harmonics and affected by a sustained arc fault.

In one embodiment of an arc fault simulation, DC voltage source 202 generates a 1000 Volts DC voltage, AC voltage sources 204 and 206 superimpose 120 Hz and 2000 Hz harmonics, respectively, on the 1000 V DC voltage, and switching unit 220 is actuated to generate a sustained arc at 0.5 seconds into the simulation, as shown in graph 400 of FIG. 4.

Figure 5:
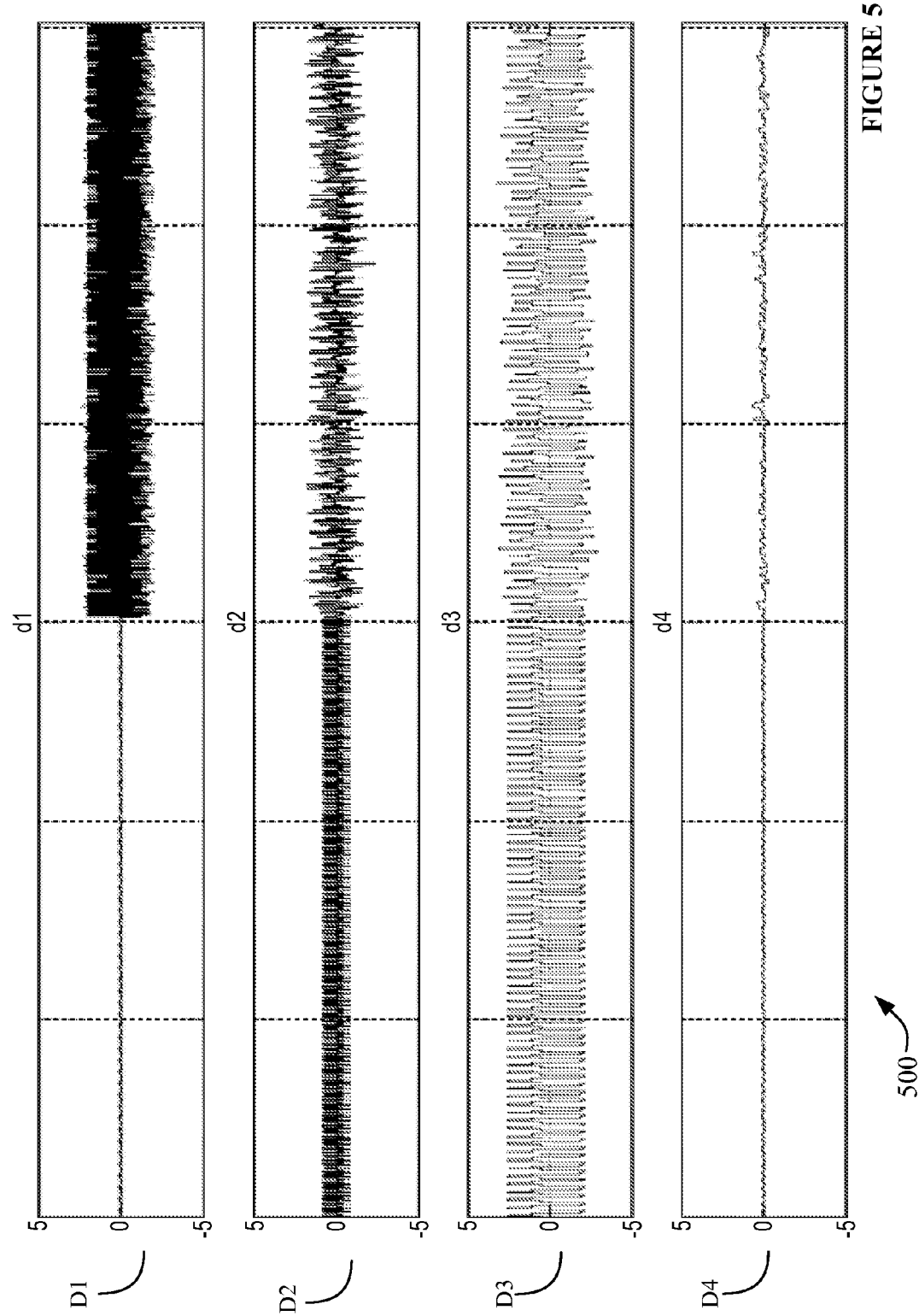
FIG. 5 is a graph illustrating a plurality of detailed signal waveforms corresponding to successive decompositions of the wavelet-transformed DC voltage waveform.

As shown in graph 500 of FIG. 5, each of unbuffer modules 226a-226d provides a respective detail signal waveform D1-D4, each of which represents a different level of a detailed decomposition of the augmented DC voltage. Each different level is characterized by a different time and frequency resolution. Based on these detailed waveforms D1-D4, one can appreciate that the simulated arc was easily detected by this proposed wavelet technique (i.e., approach/process).

Figure 6A:
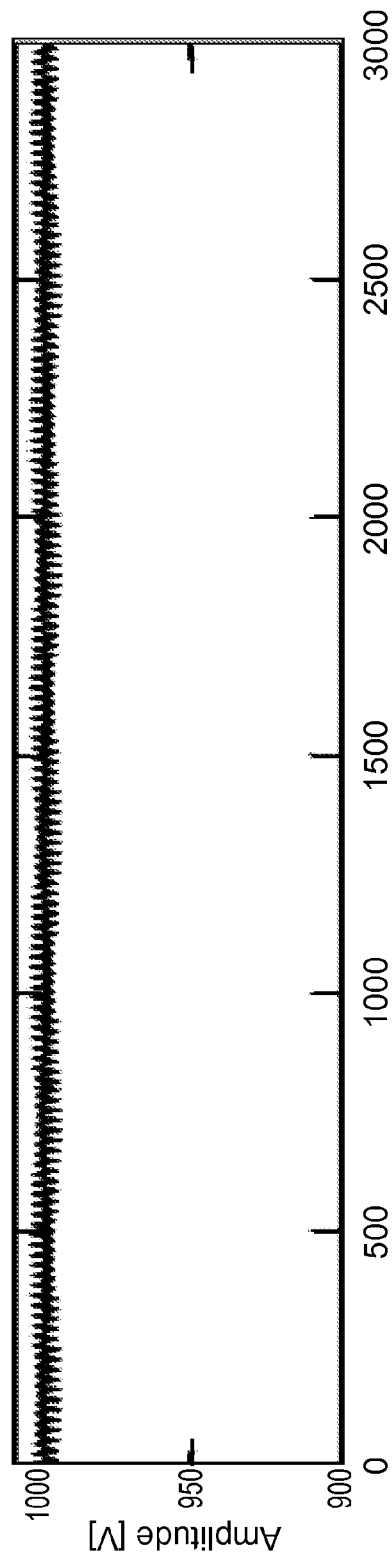
FIG. 6A is a graph illustrating another DC voltage waveform superimposed by two harmonics and affected by random arc flashes.
Figure 6B:
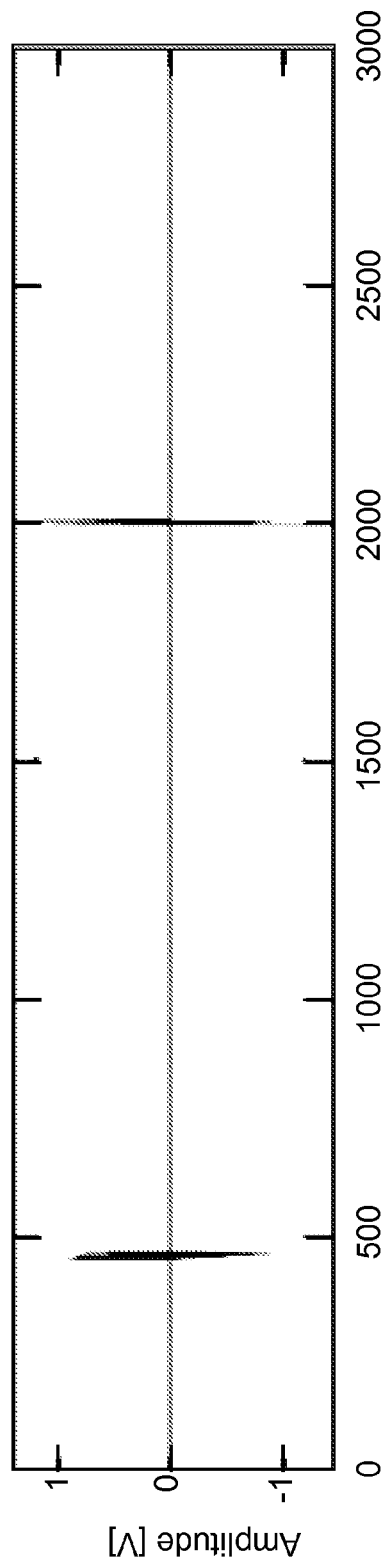
FIG. 6B is a graph illustrating spikes associated with random arc flashes.
Figure 7:
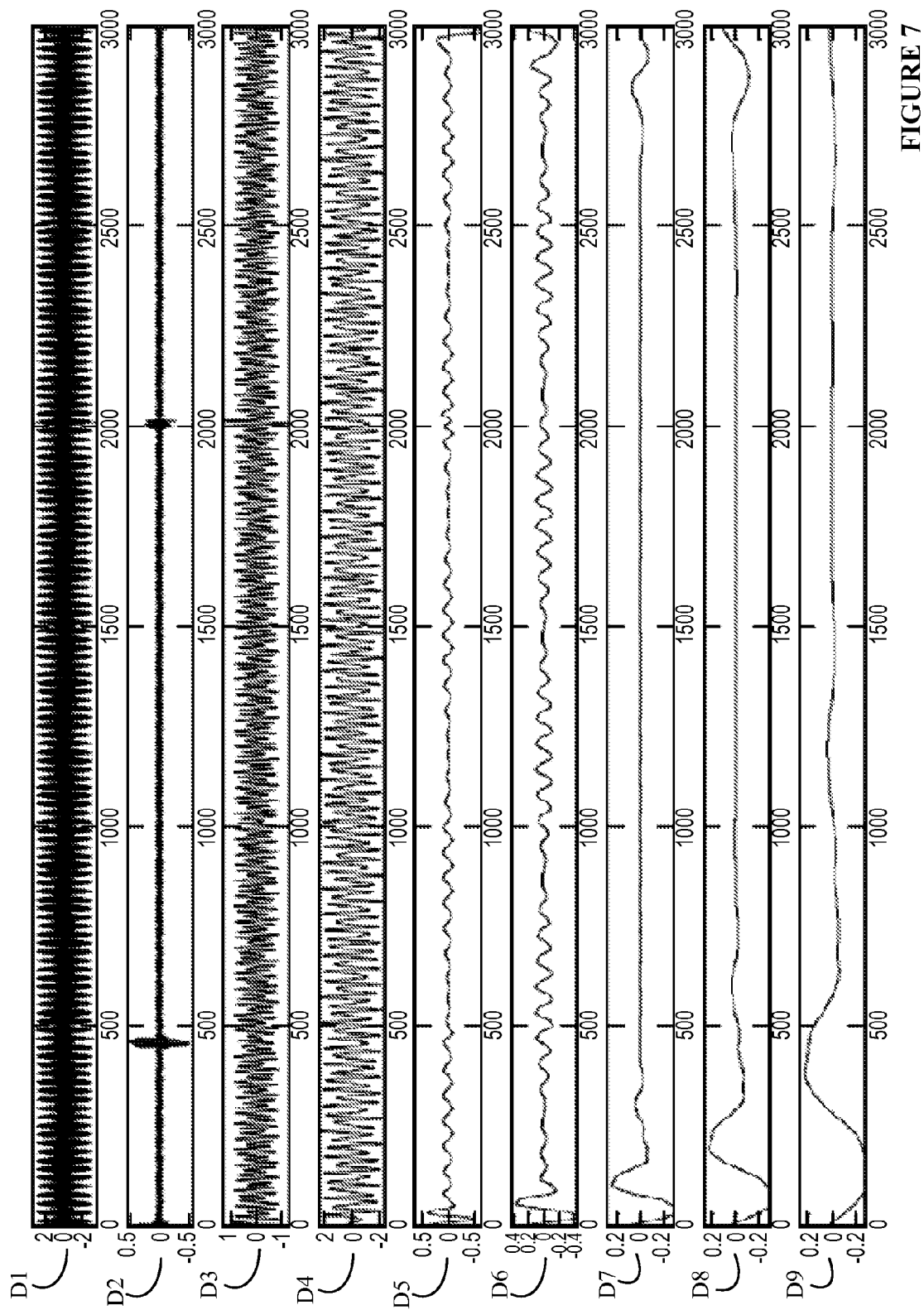
FIG. 7 illustrates nine graphs representing nine detailed decomposition signal waveforms.
Figure 8:
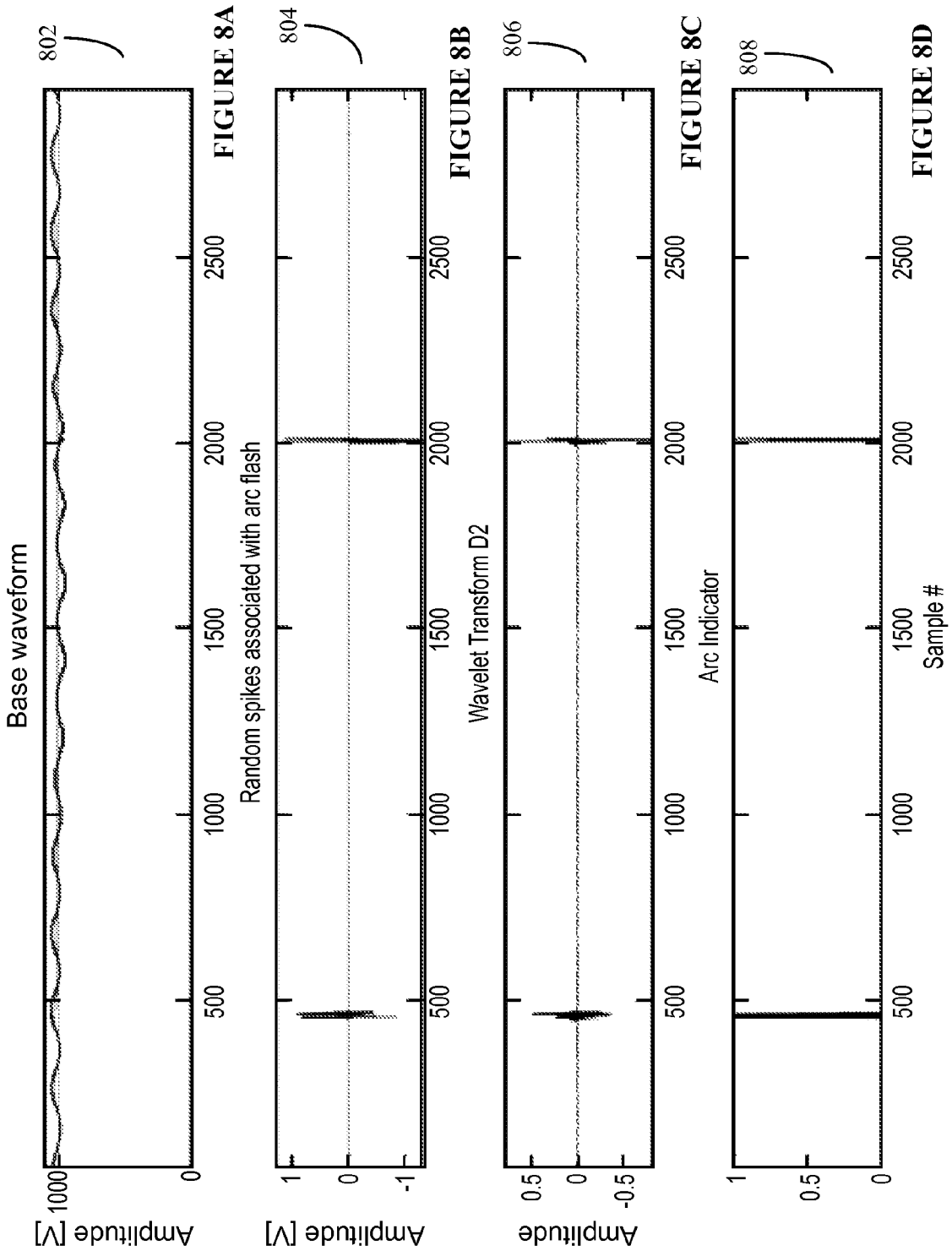
FIGS. 8A-D are graphs illustrating a base waveform, spikes associated with random flashes, a detailed decomposition signal waveforms that identified the random flashes, and an arc indicator, respectively.

As stated above, an arc flash can be generated by sparking or dielectric breakdown before a sustained arc forms. In one simulation embodiment to detect arc flashes, as shown in FIG. 6A, DC voltage source 202 generates a 1000 Vdc voltage, and AC voltage sources 204 and 206 superimpose 47.7 Hz and 477 Hz harmonics, respectively, on the 1000 Vdc voltage, and switching unit 220 is actuated to generate arc flashes. For this simulation embodiment, wavelet decomposition module 218 is configured to generate nine (9) detail signal waveforms D1-D9. As shown in FIG. 6B, voltage spikes associated with random arc flashes are detected via wavelet decomposition module 218 as represented by detailed waveform D2 shown in FIG. 7.

Now referring to FIGS. 8A-8D, four graphs 800A-800D illustrates a base waveform of the 1000 Vdc voltage augmented with the above identified harmonics, random spikes associated with arc flash, a detailed waveform D2, and an arc indicator, respectively. As illustrated in graphs 800A-800D, two arc flashes occur at about 500 msecs and at 2000 msecs.

In addition to detecting arc faults and flashes that affect DC waveforms (voltage and current), the proposed wavelet technique is further configured to detect arc faults and flashes that can affect AC waveforms (voltage and current). Now referring to FIG. 9, an exemplary embodiment of an arc fault and flash simulation and detection system 900 is shown. Unlike simulation and detection system 200, system 900 is configured to analyze AC waveforms.

As shown, system 900 includes an AC voltage source 902 and AC voltage sources 904 and 906, which are configured to augment an AC voltage provided by AC voltage source 902 with select harmonics. System 900 further includes a current measurement unit 908, a couple of voltage measurement units 910 and 912, a voltage scope unit 914, a current scope unit 916, and a wavelet decomposition unit 918, and a switching unit 920 configured to simulate arc faults and flashes.

Figure 9:
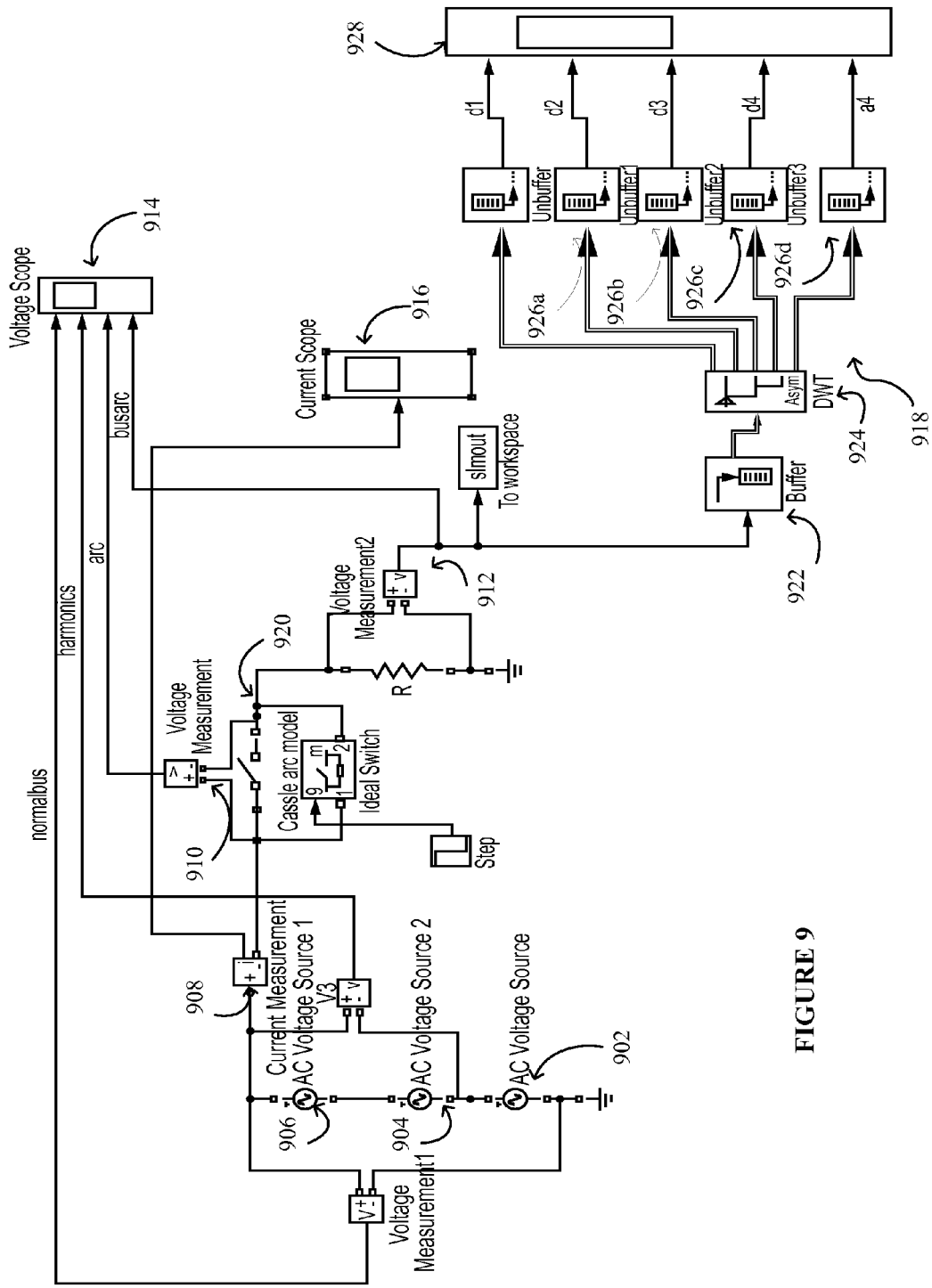
FIG. 9 is a block diagram of a system configured for simulating arc flashes and faults and detecting them using wavelets applied to AC signal waveforms.

As shown in FIG. 9, in one embodiment, wavelet decomposition unit 918 includes a buffer unit 922, a DWT unit 924, and five unbuffer modules 926a-926e, each of which provides a corresponding decomposed detailed waveform to a wavelet scope unit 928.

Figure 10:
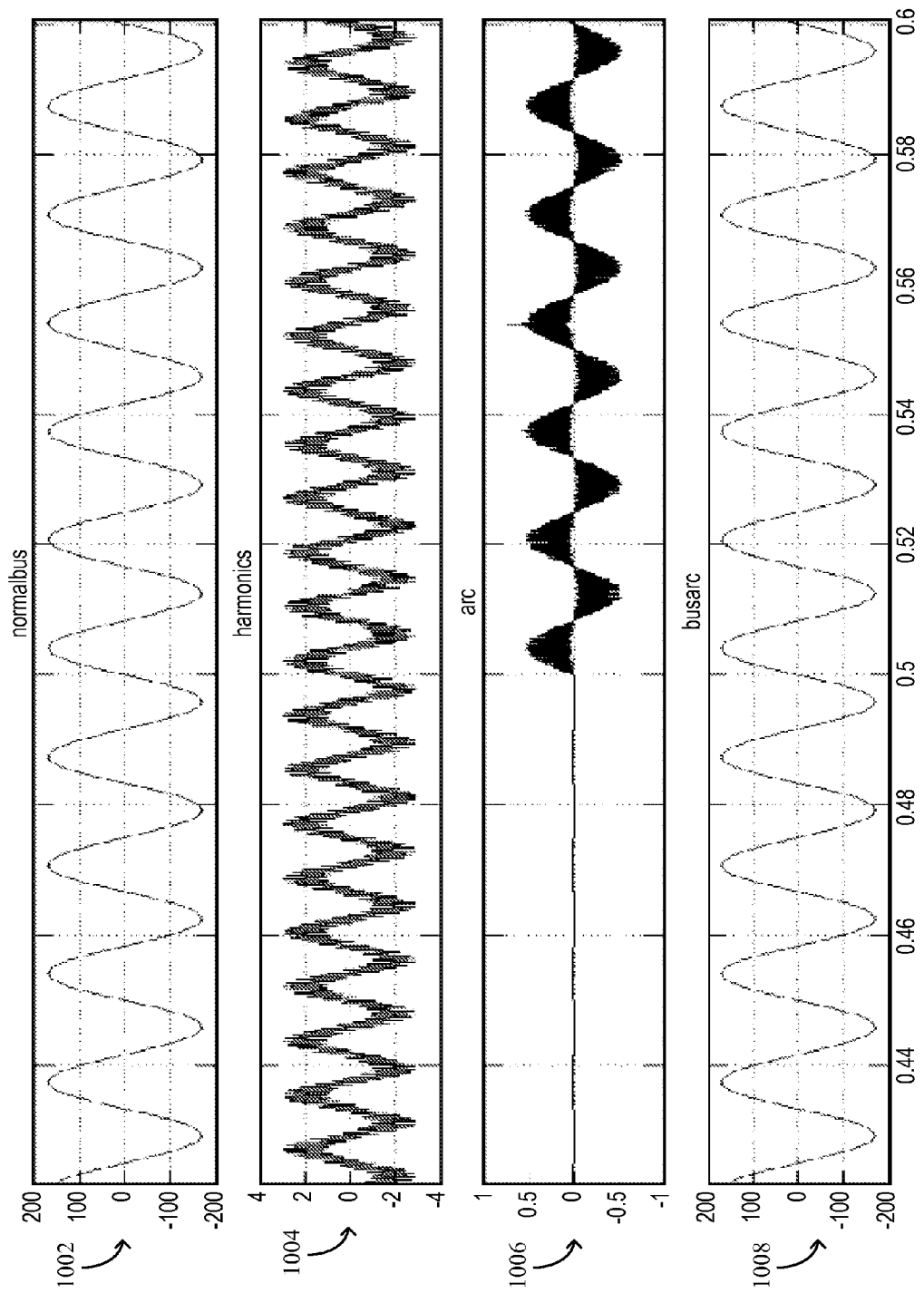
FIG. 10 is a graph illustrating an AC voltage waveform superimposed by a select number of harmonics and affected by a sustained arc fault.

In one embodiment of an arc fault simulation, AC voltage source 902 generates a 120 Vrms AC voltage, AC voltage sources 904 and 906 superimpose 120 Hz and 2000 Hz harmonics, respectively, on the 120 Vrms AC voltage, and switching unit 920 is actuated to generate a sustained arc at 0.5 seconds into the simulation, as shown in graph 1000 of FIG. 10.

Figure 11:
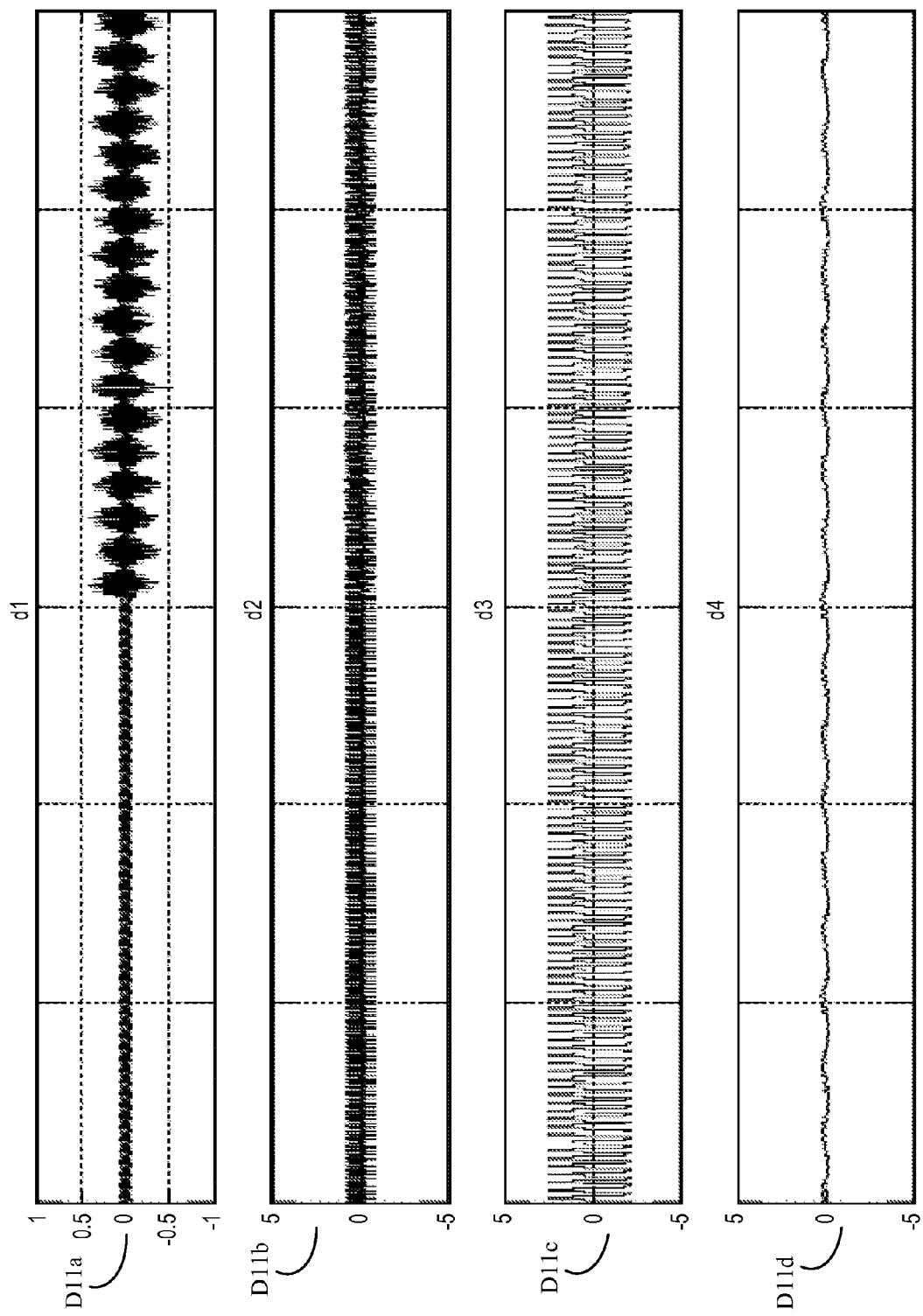
FIG. 11 is a graph illustrating a plurality of detailed signal waveforms derived corresponding to successive decompositions of the wavelet-transformed AC voltage waveform.

As shown in graph 1100 of FIG. 11, each of unbuffer modules 926a-926d is configured to provide a corresponding decomposed detailed waveform D1-D5. Based on these detailed waveforms D1-D5, one can appreciate that the simulated arc affecting the AC voltage was easily detected by this proposed wavelet technique.

Figure 12A:
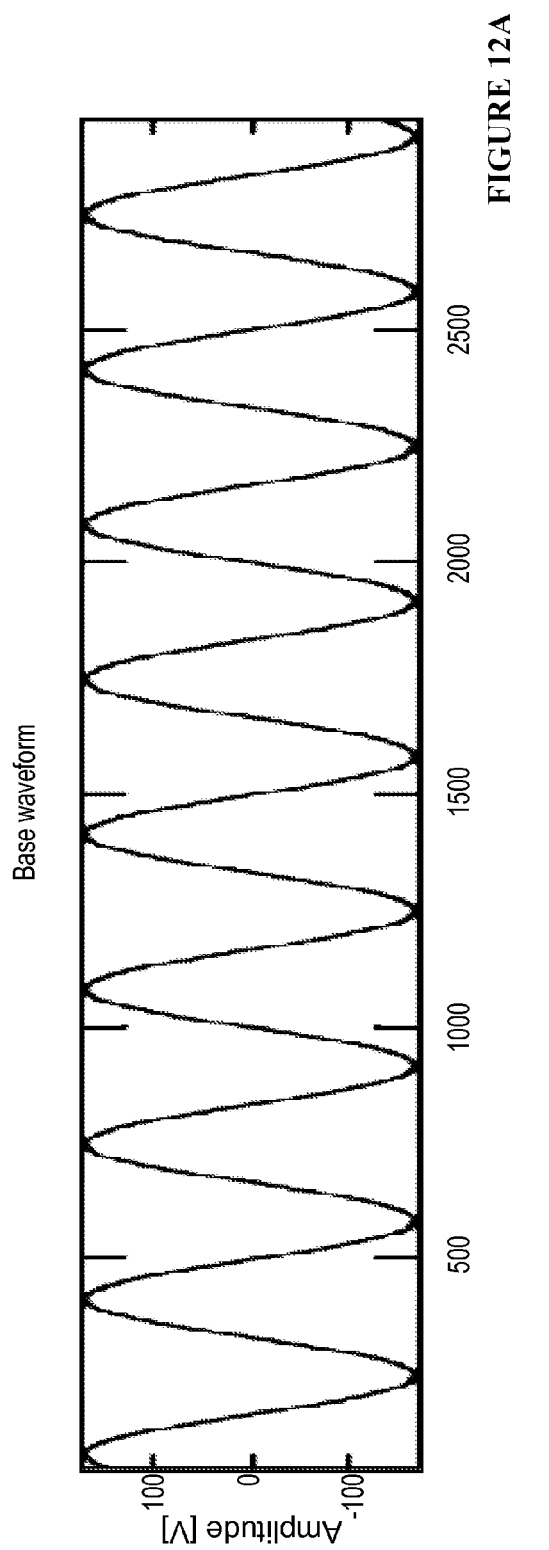
FIG. 12A is a graph illustrating another AC voltage waveform superimposed by two harmonics and affected by random arc flashes.
Figure 12B:
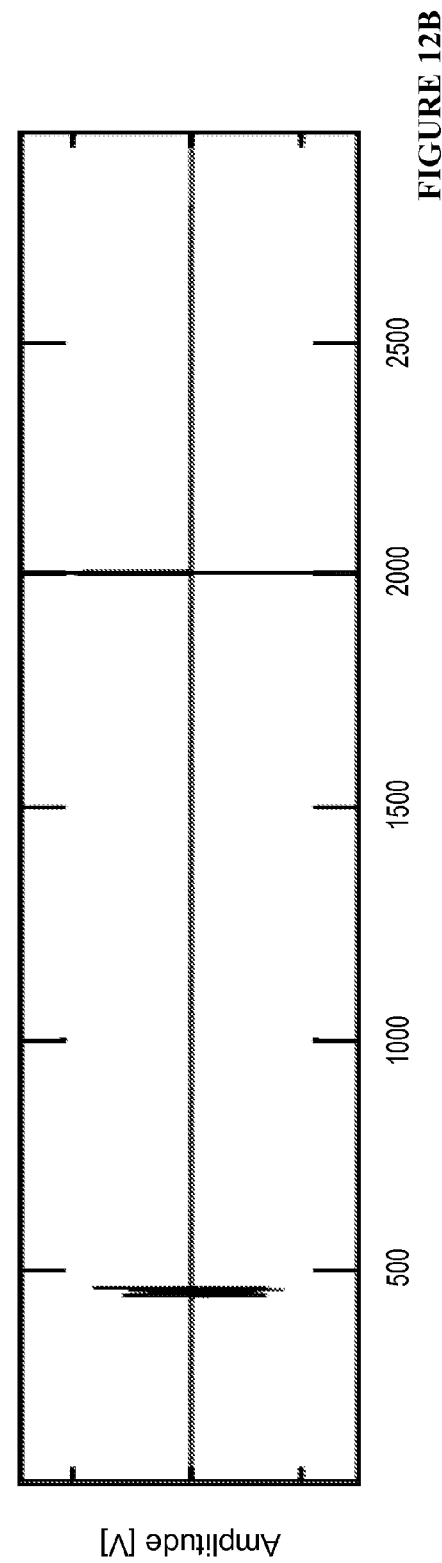
FIG. 12B is a graph illustrating spikes associate with random arc flashes.
Figure 13:
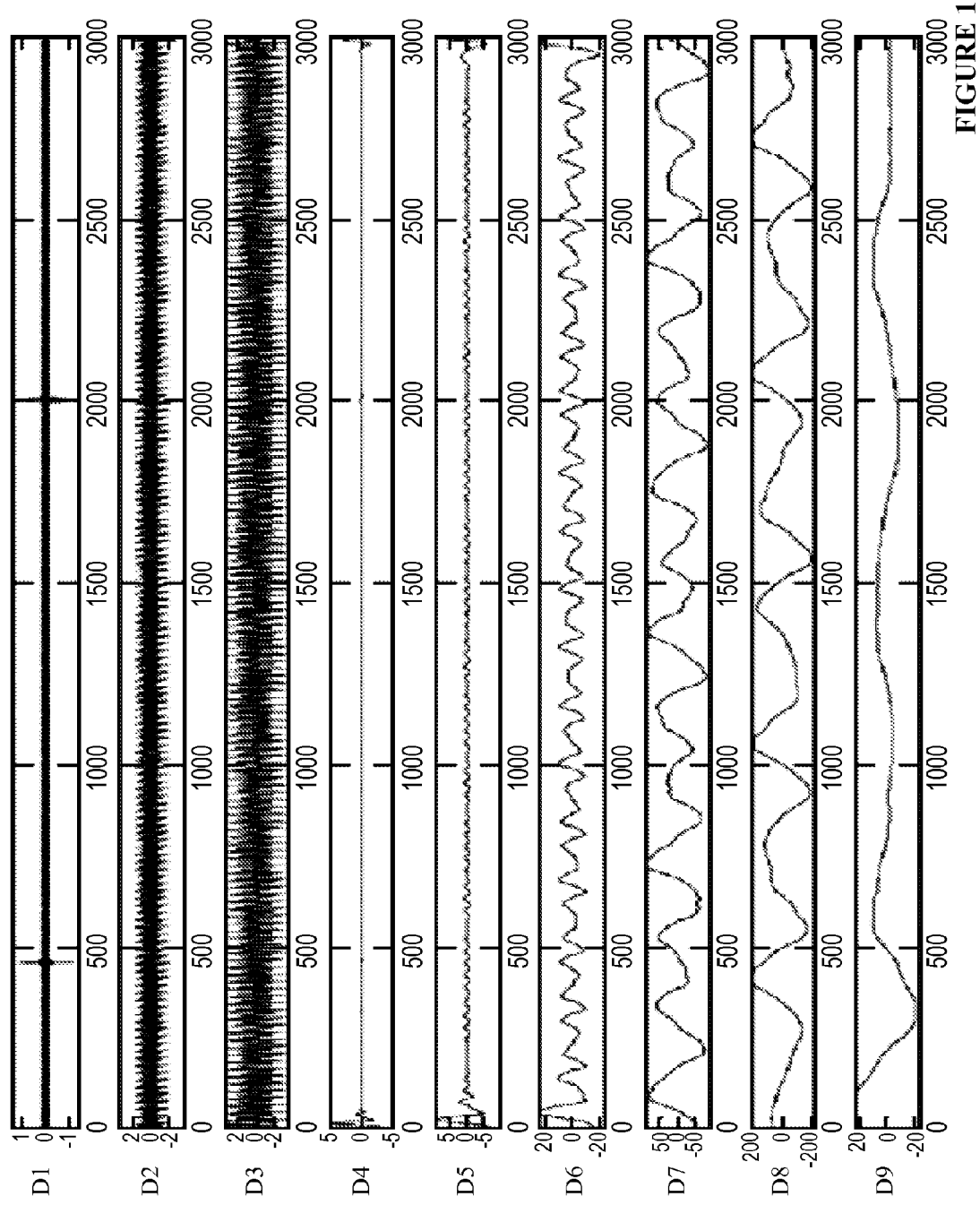
FIG. 13 illustrates nine graphs representing nine detailed decomposition signal waveforms.
Figures 14A, 14B, 14C, 14D:
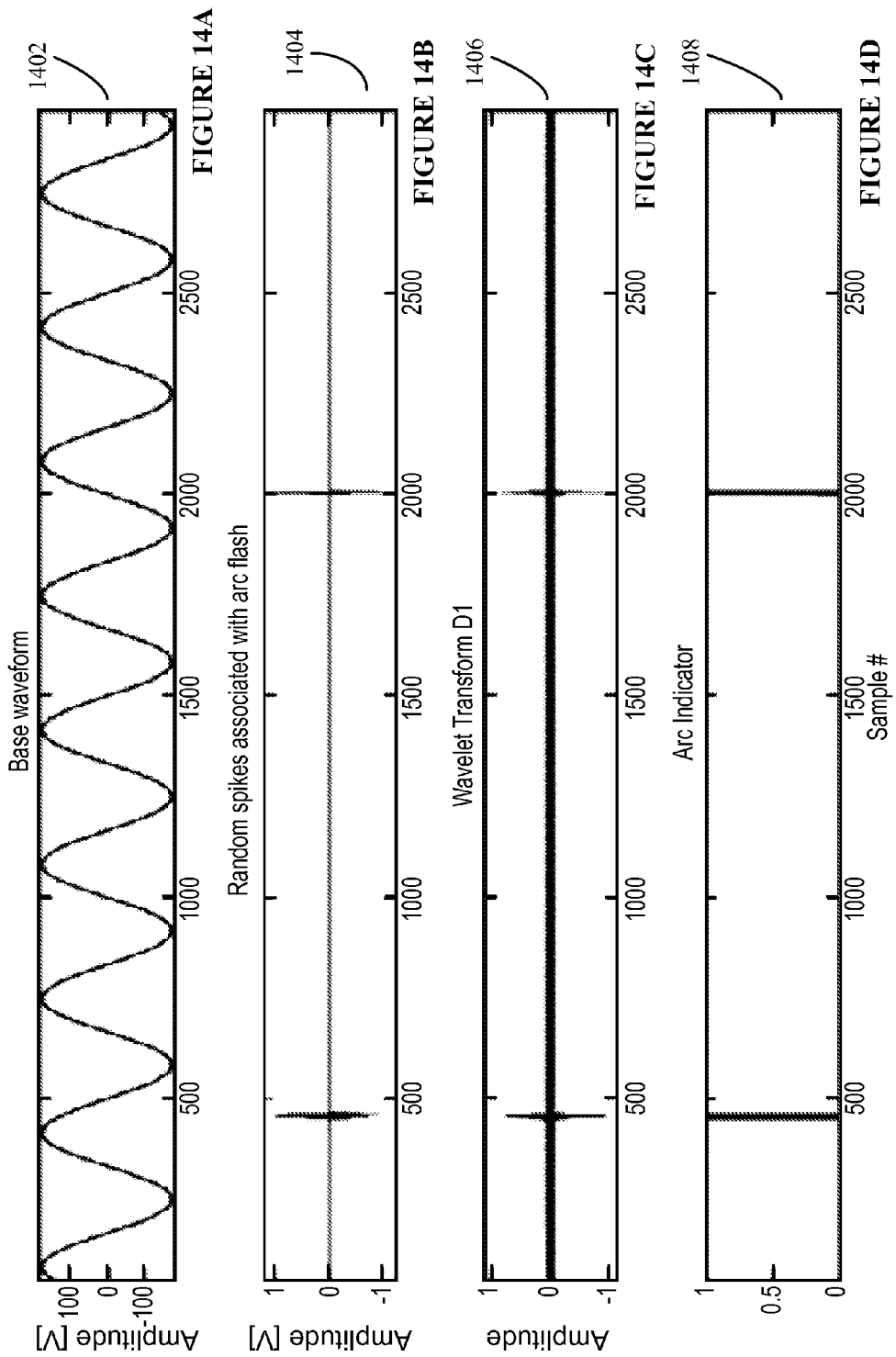
FIGS. 14A-D are graphs illustrating a base waveform, spikes associated with random flashes, a detailed decomposition signal waveform that identifies the random flashes, and an arc flash indicator, respectively.

In one simulation embodiment to detect arc flashes, as shown in FIG. 12A, AC voltage source 902 generates a 120 Vrms AC voltage, and AC voltage sources 204 and 206 superimpose select harmonics, on the 120 Vrms AC voltage, and switching unit 920 is actuated to generate arc flashes. For this simulation embodiment, wavelet decomposition unit 918 is modified to provide nine (9) decomposition units 926a-926i, each of which generates a corresponding decomposed detailed waveform D1-D9. As shown in FIG. 12B, voltage spikes associated with random arc flashes are detected via wavelet decomposition unit 918 as represented by one of the 9 detailed decomposed detailed waveforms, namely D1, as shown in FIG. 13.

Now referring to FIGS. 14A-14D, four graphs 1400A-1400D illustrates a base waveform of 120 Vrms AC voltage augmented with the above identified harmonics, random spikes associated with an arc flash, a wavelet transform of detailed decomposition signal waveform D1, and an arc indicator, respectively. As illustrated, two arc flashes occurred at about 500 msecs and at 2000 msecs.

Figure 15:
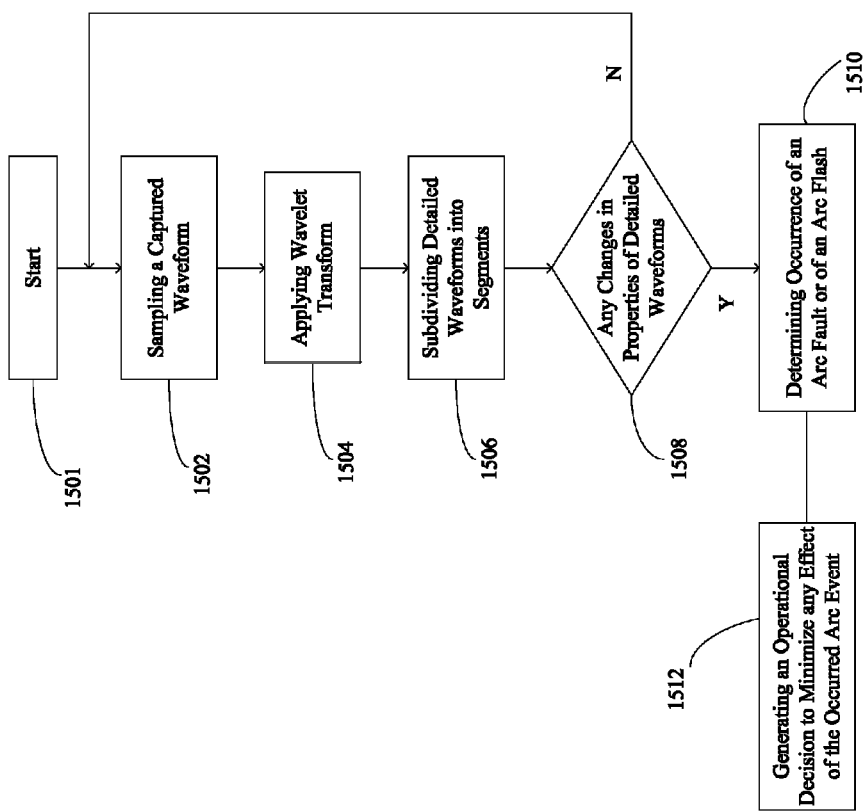
FIG. 15 is a flow chart of an embodiment of a method for detecting an arc event based on an analysis of a signal waveform using wavelets.

Now referring to FIG. 15, a flow diagram 1500 illustrates an exemplary embodiment of a method for detecting arc flashes and faults using wavelets. At Step 1502, a captured voltage signal associated with a component of an electrical system is sampled at a predetermined frequency. At Step 1504, a wavelet transform is applied to each sampling of the voltage signal waveform to generate a predetermined number of decomposed detailed waveforms using a corresponding number of successive wavelet components, each of which is a time-domain waveform that covers a predetermined frequency band. At Step 1506, each decomposed detailed waveform is subdivided into segments or windows, and these windows are analyzed and successive ones are compared to one another to detect any changes in the properties (characteristics) of the corresponding decomposed detailed waveform, at Step 1508. A changed property of a waveform, if any, can be a changed amplitude, a changed wavelength, a changed period (or frequency), a changed speed (wavelength/frequency), and/or a changed phase angle. In the affirmative, an occurrence of the arc event is confirmed and an operational decision is generated to minimize any effect of this arc event on the electrical system, at Step 1510.

Figure 16:
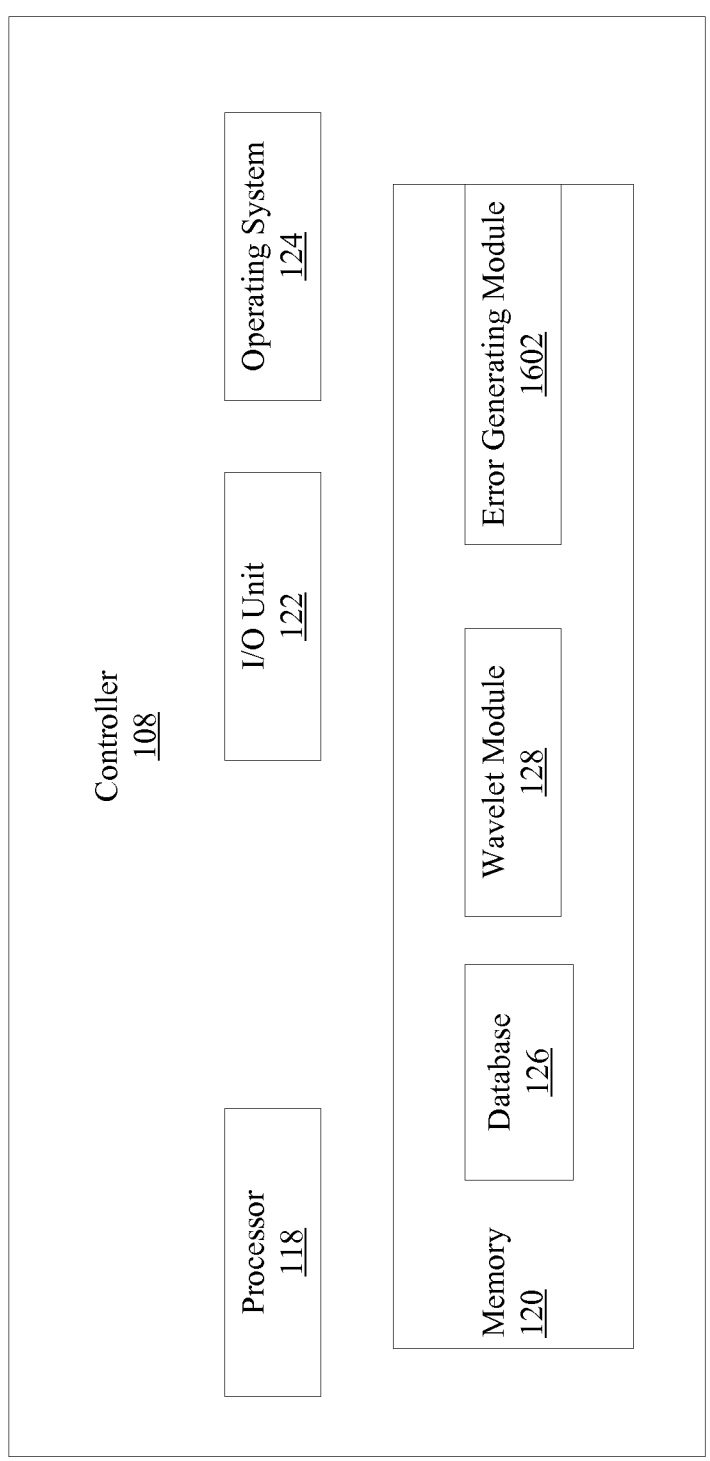
FIG. 16 is a block diagram illustrating an exemplary embodiment of a process for detecting a disturbance using an adaptive filter that identifies an error signal waveform and analyzing the error signal waveform using wavelets.

In one embodiment, the proposed method is further configured to identify an error waveform prior to applying the wavelet transform to determine the occurrence of a disturbance, which may correspond to an arc fault or an arc flash. As shown in FIG. 16, controller 108 further includes an error waveform generating module 1602. In accordance with the present disclosure, error generating module 1602 is configured to extract a disturbance/fault waveform superimposed on a fundamental voltage waveform, which was monitored until the occurrence of the disturbance. Once extracted, the error waveform is analyzed using the wavelet transform technique, as described above. Results of the analysis can then be used to determine whether the disturbance corresponds to an arc fault event or an arc flash event based their respective characteristics.

Thus, error generating module 1602 is configured to extract superimposed distortions on the measured voltage waveform. In one embodiment, the error waveform is generated using an adaptive filter 1704, which monitors properties (discussed above) of the fundamental voltage waveform. As such, adaptive filter unit 1604 enables controller 108 to analyze only the error waveform using the proposed wavelet technique.

Figure 17:
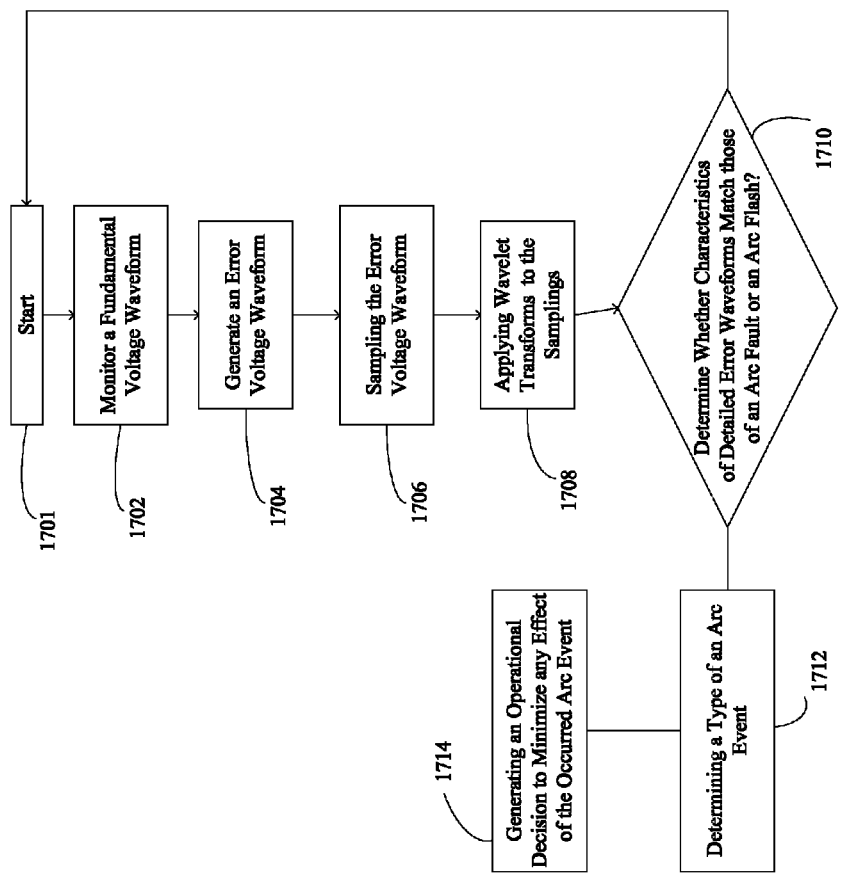
FIG. 17 is a flow chart of an embodiment of a method for detecting an arc event based on an analysis of an error waveform using wavelets.
Figure 18:
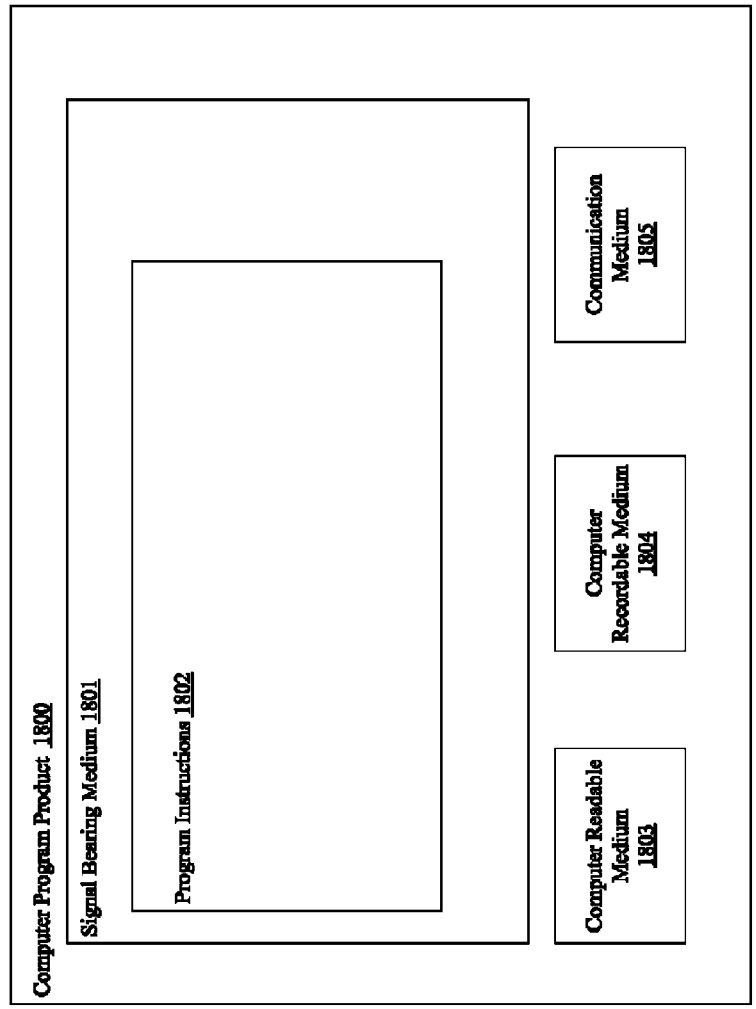
FIG. 18 is a schematic diagram illustrating a conceptual partial view of an example computer program product Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

Now referring to FIG. 17, a flow diagram 1700 illustrates another exemplary embodiment of a method for detecting arc flashes and faults using wavelet transforms. At Step 1702, adaptive waveform filtering unit 1604, which monitors a fundamental voltage waveform sensed at one component of the electrical system, generates an error voltage waveform upon detection of waveform distortions. At Step 1704, the generated error voltage waveform is sampled at a predetermined frequency. Then at Step 1706, a wavelet transform is applied to each sampling of the error voltage waveform to generate a predetermined number of decomposed detailed error waveforms using a corresponding number of successive wavelet components, each of which is a time-domain waveform that covers a predetermined frequency band. At Step 1708, the decomposed detailed error waveforms are analyzed to determine whether their characteristics are substantially similar to those of an arc fault or an arc flash (i.e., characteristics comparison). In the affirmative, an occurrence of the arc fault or an arc flash event is confirmed and an operational decision is to minimize any effect of the occurred arc event on the electrical system, at Step 1710.

While specific embodiments have been described above, one of ordinary skill in the art appreciates that various modifications and changes can be made without departing from the scope of the disclosure as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The disclosure is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes", "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. A computer-implemented method for detecting an arc event occurring in an electrical system, comprising:
   sensing a voltage using a voltage sensing device coupled to a component of the electrical system, wherein the component need not be conductively directly connected to an occurrence location of the arc event in the electrical system;
   producing a signal waveform representative of the sensed voltage using the voltage sensing device;
   sampling at a predetermined frequency the voltage signal waveform to generate a plurality of sample waveforms;
   applying a wavelet transform to each of the plurality of sample waveforms to decompose them into a predetermined number of waveforms using a corresponding number of successive wavelet components, wherein each of the successive wavelet components is a time-domain waveform that spans a predetermined range of frequencies;
   dividing each waveform into a plurality of segments;
   analyzing the plurality of segments to detect a change in one of the characteristics of the corresponding detailed waveform within the segments and/or between the segments; and
   determining an occurrence of the arc event based on the detected change of one or more of the properties of the corresponding plurality of waveforms.

2. The computer-implemented method of claim 1, wherein analyzing the plurality of segments comprises:
   comparing successive segments to detect the change in one of the properties of the corresponding decomposed detailed waveform.

3. The computer-implemented method of claim 1, further comprising determining a type of the arc event.

4. The computer-implemented method of claim 1, wherein the sensed voltage is an AC voltage or a DC voltage.

5. The computer-implemented method of claim 1, wherein each of the detailed waveforms represents a different level of the corresponding decomposed sample waveform, wherein the different level is characterized by a different band of frequencies comprising the original sensed signal.

6. The computer-implemented method of claim 1, wherein the one of the detected changed properties is one of a changed amplitude, a changed wavelength, a changed period (or frequency), a changed speed (wavelength/frequency), and a changed phase angle.

7. The computer-implemented method of claim 1, further comprising:
   generating an indicator that an arc flash or fault has been detected.

8. The computer-implementation method of claim 1, further comprising: a process in which the indicator is used to minimize any deleterious effect of the determined type of the arc event.

9. The computer-implemented method of claim 1, wherein the determined type of the arc event is an arc fault or an arc flash.

10. The computer-implemented method of claim 9, wherein the arc flash is identified based on a duration of the change of the one of the characteristics within a segment, from segment to segment, or from a first plurality of decomposed waveforms to a second plurality of decomposed waveforms.

11. A system for detecting an arc event occurring in an electrical system, comprising:
   a voltage sensing device for sensing a voltage, wherein the voltage sensing device is coupled to a component of the electrical system, wherein the component is not conductively directly connected to an occurrence location of the arc event in the electrical system, wherein the voltage sensing device produces a signal waveform representative of the sensed voltage; and
   a controller configured to:
      sample at a predetermined frequency the voltage signal waveform to generate a plurality of sample waveforms;
      apply a wavelet transform to each of the plurality of sample waveforms to decompose them into a predetermined number of detailed waveforms using a corresponding number of successive wavelet components, wherein each of the successive wavelet components is a time-domain waveform that covers a predetermined frequency band;
      divide each detailed waveform into a plurality of segments;

analyze the plurality of segments to detect a change in one of the properties of the corresponding detailed waveform within the segments and/or between the segments; and determine an occurrence of the arc event based on the detected change of one of the properties of the corresponding detailed waveform.

12. The system of claim 11, wherein in order to analyze the plurality of segments the controller compares successive segments to detect the change in one of the properties of the corresponding decomposed detailed waveform.

13. The system of claim 11, wherein each of the detailed waveforms represents a different level of the corresponding decomposed sample waveform, wherein the different level is characterized by a different time and frequency resolution.

14. The system of claim 11, wherein the one of the detected changed properties is one or a combination of a changed amplitude, a changed wavelength, a changed period (or frequency), a changed speed (wavelength/frequency), and a changed phase angle.

15. The system of claim 11, wherein the controller is further configured to:

generate an operational decision to minimize any effect of the determined type of the arc event.

16. The system of claim 11, wherein the controller is further configured to:

hasten an extinction of the arc event.

17. The system of claim 15, wherein the determined type of the arc event is an arc fault or an arc flash.

18. The system of claim 17, wherein the arc flash is identified based on an arc flash is identified based on a duration of the change of the one of the characteristics within a segment, from segment to segment, or from a first plurality of decomposed waveforms to a second plurality of decomposed waveforms.

19. A computing system, comprising:

a processing unit and a memory unit for storing instructions that are operable, when executed by the processing unit, to perform a method for detecting an arc event occurring in an electrical system, the method comprising:

sensing a voltage using a voltage sensing device coupled to a component of the electrical system, wherein the component is not conductively directly connected to an occurrence location of the arc event in the electrical system;

producing a signal waveform representative of the sensed voltage using the voltage sensing device;

sampling at a predetermined frequency the voltage signal waveform to generate a plurality of sample waveforms;

applying a wavelet transform to each of the plurality of sample waveforms to decompose them into a predetermined number of detailed waveforms using a corresponding number of successive wavelet components, wherein each of the successive wavelet components is a time-domain waveform that covers a predetermined frequency band;

partitioning each detailed waveform into a plurality of segments;

analyzing the plurality of segments to detect a change in one of the properties of the corresponding detailed waveform within the segments and/or between the segments; and determining an occurrence of the arc event based on the detected change of one of the properties of the corresponding detailed waveform.

20. The computing system of claim 19, further comprising:

generating an operational decision to minimize any effect of the determined type of the arc event or hasten the extinction of the arcing event.

21. The computing system of claim 19, wherein the determined type of the arc event is an arc fault or an arc flash.

22. The computing system of claim 21, wherein the arc flash is identified based on an duration and characteristics of the plurality of decomposed waveforms of the sensed voltage or current.

* * * * *